United States Patent
Cabral, Jr. et al.

(10) Patent No.: US 6,987,050 B2
(45) Date of Patent: *Jan. 17, 2006

(54) SELF-ALIGNED SILICIDE (SALICIDE) PROCESS FOR LOW RESISTIVITY CONTACTS TO THIN FILM SILICON-ON-INSULATOR AND BULK MOSFETS AND FOR SHALLOW JUNCTIONS

(75) Inventors: Cyril Cabral, Jr., Ossining, NY (US); Kevin Kok Chan, Staten Island, NY (US); Guy Moshe Cohen, Mohegan Lake, NY (US); Christian Lavoie, Ossining, NY (US); Ronnen Andrew Roy, Ossining, NY (US); Paul Michael Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

This patent is subject to a terminal disclaimer.

(21) Appl. No.: 09/902,483

(22) Filed: Jul. 11, 2001

(65) Prior Publication Data

US 2002/0022366 A1 Feb. 21, 2002

Related U.S. Application Data

(63) Continuation-in-part of application No. 09/569,306, filed on May 11, 2000.

(51) Int. Cl.
*H01L 21/331* (2006.01)
*H01L 21/336* (2006.01)
*H01L 21/3205* (2006.01)
*H01L 21/4763* (2006.01)
*H01L 21/44* (2006.01)

(52) U.S. Cl. .................. 438/301; 438/303; 438/311; 438/592; 438/655; 438/663; 438/664; 438/682; 438/683

(58) Field of Classification Search ............... 438/655, 438/682, 683, 300, 664, 301, 303, 311, 663, 438/592
See application file for complete search history.

(56) References Cited

U.S. PATENT DOCUMENTS

| | | | |
|---|---|---|---|
| 4,443,930 A | 4/1984 | Hwang et al. | |
| 4,912,542 A | 3/1990 | Suguro | |
| 5,510,295 A | * 4/1996 | Cabral et al. | 438/656 |

(Continued)

FOREIGN PATENT DOCUMENTS

| | | |
|---|---|---|
| EP | 0 924 773 A1 | 12/1998 |
| JP | 11-177103 | 7/1999 |
| KR | 2001-6796 | 1/2001 |

OTHER PUBLICATIONS

U.S. Appl. No. 09/515,033, YOR900–0044US1, "Method For Self–Aligned Formation Of Silicide Contacts Using Metal Silicon Alloys For Limited Silicon Consumption And For Reduction Of Bridging", pp. 1–21, and Figs. 1A–3B. Now U.S. Patent 6,323,130.

(Continued)

*Primary Examiner*—Erik Kielin
(74) *Attorney, Agent, or Firm*—Wan Yee Cheung, Esq.; McGinn & Gibb, PLLC

(57) ABSTRACT

A method (and resulting structure) for fabricating a silicide for a semiconductor device, includes depositing a metal or an alloy thereof on a silicon substrate, reacting the metal or the alloy to form a first silicide phase, etching any unreacted metal, depositing a silicon cap layer over the first silicide phase, reacting the silicon cap layer to form a second silicide phase, for the semiconductor device, and etching any unreacted silicon. The substrate can be either a silicon-on-insulator (SOI) substrate or a bulk silicon substrate.

28 Claims, 6 Drawing Sheets

U.S. PATENT DOCUMENTS

| | | | | |
|---|---|---|---|---|
| 5,608,266 | A | * | 3/1997 | Agnello et al. ............. 257/768 |
| 5,624,869 | A | * | 4/1997 | Agnello et al. ............. 438/602 |
| 5,773,331 | A | | 6/1998 | Solomon et al. |
| 5,828,131 | A | * | 10/1998 | Cabral et al. ............. 257/757 |
| 5,830,775 | A | * | 11/1998 | Maa et al. ................. 438/141 |
| 5,962,893 | A | | 10/1999 | Omura et al. |
| 5,994,191 | A | * | 11/1999 | Xiang et al. ............... 148/305 |
| 5,998,807 | A | | 12/1999 | Lustig et al. |
| 6,015,752 | A | * | 1/2000 | Xiang et al. ............... 438/655 |
| 6,054,386 | A | | 4/2000 | Prabhakar |
| 6,087,208 | A | | 7/2000 | Krivokapic et al. ........ 438/183 |
| 6,165,903 | A | * | 12/2000 | Besser et al. ............. 438/301 |
| 6,169,005 | B1 | | 1/2001 | Kepler |
| 6,239,492 | B1 | | 5/2001 | Meikle et al. |
| 6,297,148 | B1 | * | 10/2001 | Besser et al. ............. 438/636 |
| 6,323,130 | B1 | | 11/2001 | Brodsky et al. |
| 6,413,386 | B1 | | 7/2002 | Callegari et al. |
| 6,433,388 | B2 | | 8/2002 | Kanamori |
| 6,444,578 | B1 | * | 9/2002 | Cabral et al. ............. 438/682 |
| 6,503,833 | B1 | * | 1/2003 | Ajmera et al. ............. 438/682 |
| 6,555,839 | B2 | | 4/2003 | Fitzgerald |
| 2002/0009856 | A1 | * | 1/2002 | Kanamori .................. 438/300 |
| 2002/0106879 | A1 | * | 8/2002 | Akram ....................... 438/586 |
| 2003/0068883 | A1 | * | 4/2003 | Ajmera et al. ............. 438/664 |
| 2003/0132487 | A1 | * | 7/2003 | Cabral et al. ............... 257/384 |

OTHER PUBLICATIONS

Lisa T. Su, Melanie J. Sherony, Hang Hu, James E. Chung, and Dimitri A. Antoniadis; Optimization of Series Resistance in Sub–0.2, um SOI MOSFET's; IEEE Electron Device Letters, vol. 15, No. 9, Sep. 1994; pp. 363–365.

T. Yoshitomi, M. Saito, T. Ohguro, M. Ono, H.S. Momose, and H. Iwai; Silicided Silicon–Sidewall Source and Drain (S4D) structure for high–performance 75–nm gate length pMOSFETs; 1995 Symposium on VLSI Technology Digest of Technical Papers; 0–7803–2602–4/95; pp. 11 and 12.

T. Yachi and S. Suyama; "A New Method Utilizing Ti–Silicide Oxidation for the Fabrication of a MOSFET with a Self–Aligned Schottky Source/Drain"; IEEE Electron Device Letters, vol EDL–4, No. 8, Aug. 1983; pp. 277–279; and Silicides for VLSI Applications; S.P. Murarka; pp. 138–141.

* cited by examiner

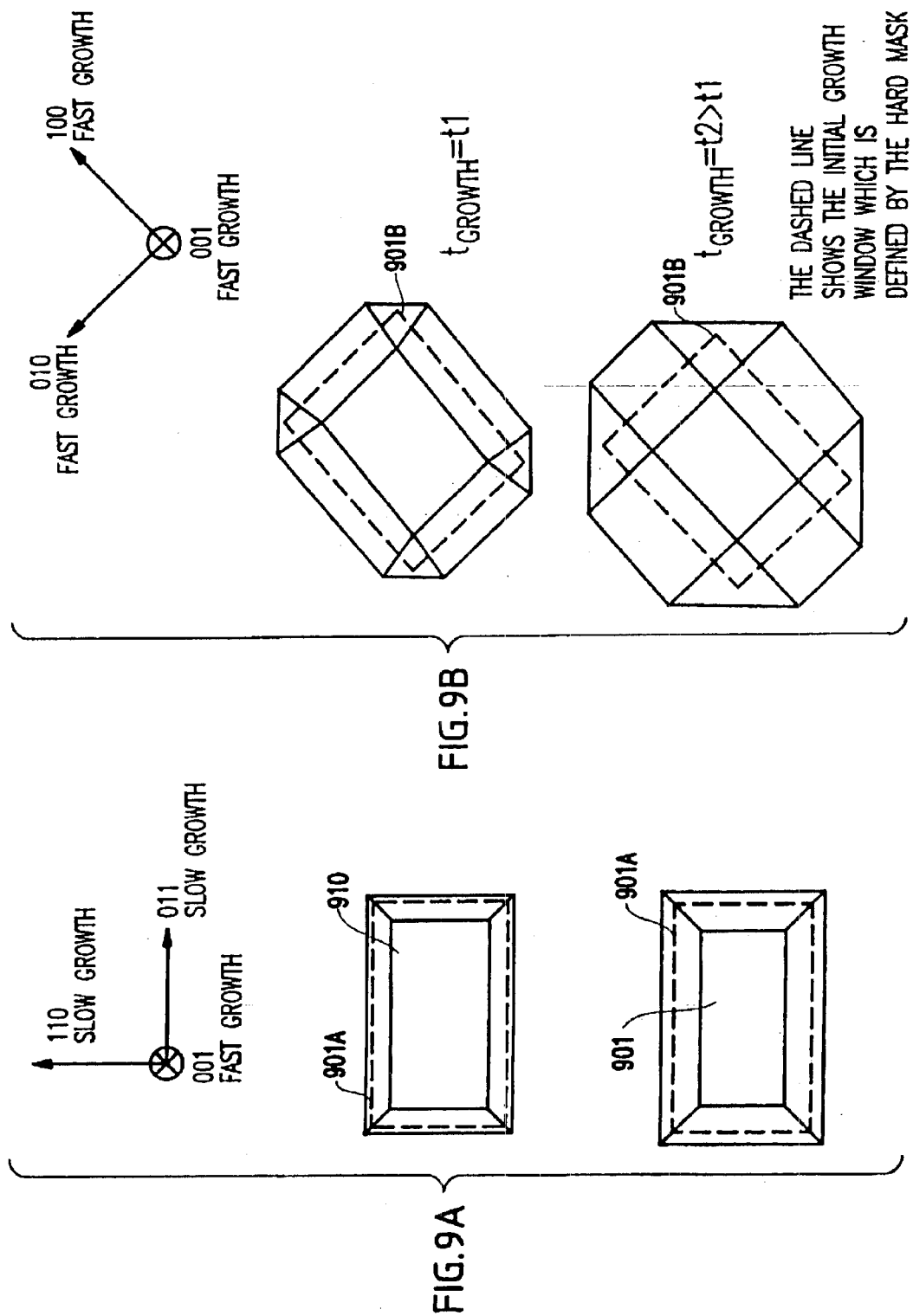

SELF-ALIGNED SILICIDE (SALICIDE) PROCESS FOR LOW RESISTIVITY CONTACTS TO THIN FILM SILICON-ON-INSULATOR AND BULK MOSFETS AND FOR SHALLOW JUNCTIONS

CROSS-REFERENCE TO RELATED APPLICATIONS

The present application is a continuation-in-part of U.S. patent application Ser. No. 09/569,306, to Chan et al., having IBM Docket No. YO999-408, filed on May 11, 2000, incorporated herein by reference.

U.S. GOVERNMENT RIGHTS IN THE INVENTION

The subject matter of the present Application was at least partially funded under the Grant No. N66001-97-1-8908 from the U.S. Defense Advanced Research Projects Agency (DARPA).

BACKGROUND OF THE INVENTION

1. Field of the Invention

The present invention generally relates to bulk MOSFETS and silicon-on-insulator (SOI) MOSFETs and specifically, a self-aligned silicide (salicide) process for thin film SOI MOSFETs having low resistivity contacts and a self-aligned silicide (salicide) process for shallow junctions.

2. Description of the Related Art

Conventionally, a reduction of a short channel effect in a silicon-on-insulator (SOI) MOSFET has been addressed by using ultra-thin silicon films (e.g., having a thickness substantially within a range of about 50 nm to about 3 nm). However, using an ultra-thin SOI film can result in high source/drain series resistance. A portion of the high source/drain series resistance can be reduced by using a self-aligned silicide (salicide) contact (e.g., for a discussion of salicides, see Lisa T. Su et al., "Optimization of the series resistance in sub-0.2 $\mu$m SOI MOSFET's", *Electron Device Letters*, 15(9), p. 363, September 1994).

The conventional salicide process has been limited to bulk or thick SOI films (e.g., for purposes of the invention, a "bulk" or "thick" SOI film is thicker than 100 nm). Reduction of a SOI film thickness to an estimated 10 nm precludes the use of conventional salicide. That is, if the amount of silicon consumed by the formation of the silicide alloy becomes a large portion of the initial SOI film thickness, then the contact area will decrease, leading to an increase in the contact resistance. Further, even if a conventional salicide was used with thin films, there is no guarantee of low parasitic resistance because an ultra-thin silicon film may be completely consumed during the silicide formation. Further, the conventional salicide process can form a metal-rich silicide which is characterized by higher resistance, if there is not enough silicon to complete the reaction that forms the low resistivity silicide phase.

In the case of a thin SOI film, the percentage of the SOI consumed by the silicide considerably affects the series resistance. It has been demonstrated that when 80% or more of the SOI layer is consumed, the series resistance begins to increase as a result of a reduction in the contact area (e.g., see Su et al., supra).

Alternatively, if the silicide layer is made extremely thin (e.g., less than 30 nm) to avoid consuming the thin SOI film, then the silicide layer loses its efficiency in reducing the series resistance. For example, if the silicide is in the thick regime, then a reduction of the silicide thickness would roughly yield a proportional increase in the series resistance. This linear behavior would hold down to about 20 nm (depending on the silicide metal). A thinner silicide film may exhibit nucleation problems and some of the phases may not form. All of this would lead to a very steep increase in the contact resistance.

The series parasitic resistance must be minimized in order to facilitate the fabrication of high performance thin film SOI MOSFETs. The conventional salicide process is not applicable to the production of ultra-thin SOI MOSFETs, and therefore a new salicide process is required to overcome the problems of the conventional method.

Further, the conventional method and structures are deficient in their silicide/SOI interface roughness.

Yet another problem of the conventional structures and methods is associated with shallow junctions used in both bulk and SOI MOSFET structures. That is, shallow junctions provide many benefits when used with the fabrication of submicron MOSFET. For example, they allow for a large punch-through voltage. That is, the lateral spread of the source and drain depletion regions below the surface layer makes a MOSFET more prone to punch-through. Therefore, shallow source and drains effectively suppress subsurface punch-through path.

Additionally, shallow junctions provide better short-channel behavior, and in particular less $V_T$ roll-off (e.g., see S. Wolf, Silicon Processing for the VLSI Era, Volume 3—The Submicron MOSFET, Lattice Press, 1995).

Additionally, such shallow junctions allow for steeper junction (dopant) profiles. For example, low energy implants are used to form shallow junctions. The lateral projection range decreases with the implant energy, and therefore more abrupt junctions can be obtained.

To reduce the series resistance to the source and drain, a self-aligned (salicide) process is used in the fabrication of the MOSFET device. The top surface of the source and drain regions are silicided, by converting some of the superficial Si into silicide phases such as $CoSi_2$, or $TiSi_2$. The conventional salicide process typically consist of the following main steps.

First, blanket deposition of a metal such as Co, Ti or Ni, is performed. For example, the typical required film thickness for Co is about 8 nm. The Co deposition is followed by a TiN cap deposition of about 20 nm thick, to prevent oxidation during anneals.

Then, a first rapid thermal anneal (RTA) is performed to form the CoSi, C49 $TiSi_2$, or NiSi phase. For example, a 525C anneal would react the deposited Co with the underlay Si, converting some of the Si into CoSi.

Thereafter, selective etching of the unreacted metal is performed. For example, Co that was deposited over non-Si surfaces, such as the dielectric sidewall spacers of the device, cannot react with the Si during the anneal, and therefore would not convert into CoSi. The unreacted Co is etched selectively, leaving the CoSi regions intact.

Finally, a second RTA is performed to form the $CoSi_2$ or C54 $TiSi_2$ low resistive phase. For example, the CoSi is annealed at about 750C, to form the $CoSi_2$ phase. It is noted that the formation of the $CoSi_2$ phase requires additional consumption of Si from the source and drain regions. The $NiSi_2$ phase has a higher resistivity than NiSi. Thus, a second RTA is not applied in the case of Nickel.

The silicide forms a junction with the source or drain silicon. The location of the Silicide/Si junction plays an important role as will be explained below.

FIG. 7(a) shows a band diagram of a silicide/n-type Si junction. At the junction, there is a potential barrier referred to as the Schottky barrier. The Schottky barrier is not desirable, since it leads to a rectifying contact. For example, the Schottky barrier height of $CoSi_2$ on n-type silicon is about 0.64 eV. If the silicon doping is made very high (e.g., such as $5\times10^{19}$ $cm^{-3}$), the potential barrier narrows, and electrons can easily tunnel through the thin barrier into the semiconductor (e.g., as shown in FIG. 7(b)). The contact is then referred to as a "tunneling contact", which performs as an ohmic contact.

Referring to the structure 800 in FIG. 8, to make a good ohmic contact to the source 801 and drain 802, it is therefore essential that the silicide/Si junction form at the peak concentration of the dopants in the source 801 and drain 802. It is also imperative that the silicide/Si junction would not be deeper than the source/drain junction depth, or otherwise a leakage path forms. These requirements are summarized in FIG. 8.

Combining the shallow junction requirement with the requirements associated with the silicide/Si junction position is not trivial. As explained above, the salicide process converts some of the source and drain silicon into silicide.

For example, the silicon film thickness that is consumed in the formation of $CoSi_2$ alloy is 3.64 times thicker than the initial as deposited Co film. A Co film of 8 nm thick would yield a $CoSi_2$ film of about 28 nm, and would consume about 29 nm of silicon. On the other hand, the source and drain junction depth ($X_j$) is projected to be 20–40 nm for devices with a 100 nm gate length (e.g., see the International Technology Roadmap for Semiconductors, 1999 Edition, Semiconductor Industry Association, Executive Summary).

As may be seen by this example, if the junction is made very shallow as required by the semiconductor road map, the silicide film thickness, $X_{sil}$, and therefore the silicide/Si junction position, may even exceed the source/drain junction depth. Since the silicide film cannot be made thinner, due to the resistance constraint, the conventional salicide process must be modified to accommodate the shallow junction technology requirement.

SUMMARY OF THE INVENTION

In view of the foregoing and other problems, drawbacks and disadvantages of the conventional methods and structures, an object of the present invention is to provide a new salicide process applicable to the production of ultra-thin SOI and bulk MOSFETs (e.g., having a SOI thickness substantially within a range of about 3 nm to about 100 nm), and to MOSFETS with shallow source-drain junctions.

It is a further object to provide a new salicide process in which less of the thin SOI film is consumed, produces a thicker SOI film in a source/drain region, and is a self-aligned process.

Additionally, a further object of the invention is to stay within the thermal budget allowed for the production of conventional MOSFETs using the conventional salicide process. The thermal budget consists of both the temperature and the time length at which the wafer was held at a given temperature. Typically, to minimize the thermal budget the wafer is annealed by rapid thermal annealing (RTA) to form the silicide alloy. For example, to form the $CoSi_2$ phase from the CoSi phase the wafer is annealed at about 750° C. for 60 seconds.

A further object is to form a silicide over a shallow source-drain region in a controlled form, and in which the suicide is contained within the source-drain junction.

In a first aspect of the invention, a method for fabricating a silicide for a semiconductor device, includes depositing a metal or an alloy thereof on a silicon substrate, reacting the metal or the alloy to form a first silicide phase, etching any unreacted metal, depositing a silicon cap layer over the first silicide phase, reacting the silicon cap layer to form a second silicide phase, for the semiconductor device, and etching any unreacted silicon.

With the invention, either SOI substrates or bulk silicon substrates can be advantageously employed.

In a second aspect of the invention, a method for fabricating a silicide for a semiconductor device, includes depositing a metal or an alloy thereof on a bulk silicon substrate, reacting the metal or the alloy to form a first silicide phase, etching any unreacted metal, depositing a silicon cap layer over the first silicide phase, reacting the silicon cap layer to form a second silicide phase, for the semiconductor device, and etching any unreacted silicon. Thus, the invention is advantageously used with bulk silicon substrates.

In a third aspect of the invention, a method for fabricating a silicide for a semiconductor device, includes depositing a buried oxide layer on a substrate, applying a silicon layer to the buried oxide layer, and depositing a metal on portions of the silicon layer, thereby to form the silicide for the semiconductor device. Thus, the invention is advantageously used with silicon-on-insulator (SOI) substrates.

In a fourth aspect of the present invention, a silicide processing method for a thin silicon region, includes depositing a metal formed in a silicon film, reacting the metal at a first temperature with the silicon film to form a first alloy, selectively etching the unreacted layer of the metal, depositing a Si film on the first alloy, reacting the Si film at a second temperature to form a second alloy, and selectively etching the unreacted layer of the Si film.

In yet another aspect of the invention, the structure formed by the inventive method includes a silicon substrate, and a raised source-drain structure, including a silicided portion formed with an amorphous silicon, formed on said substrate without selective epitaxy processing, said raised source-drain structure having a surface which is facet-free and has a crystallographic shape which is arbitrary. Such a structure is advantageous over conventional structures formed, for example, by selective epitaxy in terms of conformality and coverage of the metal. Further, the structure is free of any rotational considerations with respect to patterning the wafer.

In the method of the present invention, preferably a thin-film of cobalt (Co) or a cobalt-silicon mixture ($Co_{1-x}Si_x$) is deposited on a substrate and is reacted with silicon (Si) at a low temperature to form an alloy of $Co_2Si$ (e.g., having a metal-rich phase). The Co which is not reacted is removed by selective etching. This step is similar to the etching step in the conventional salicide processing, but in the conventional process, a higher temperature anneal is used so the etching is usually performed at the CoSi formation stage. After the etching step, a non-crystalline film of Si or poly-Si is deposited and subsequently annealed to form the alloy ($CoSi_2$) followed by selective etching of the unreacted silicon.

In this manner, a reaction of Co to initially form $Co_2Si$, minimizes the silicon consumption of the thin SOI film. The consumption of the thin SOI film is additionally reduced by the deposition of a silicon or poly-silicon film on the $Co_2Si$.

The present invention extends the use of a salicide-like process to thin SOI films, which are expected to be used in future SOI MOSFETs. Such thin-film SOI films will be advantageous in making the devices smaller, reducing the source/drain to substrate overlap capacitance, and eliminating the floating body voltage.

Further, the invention provides a superior solution to the alternative method(s) which include a raised source/drain by epitaxy.

Further, with the invention, it is further possible to obtain good control in forming a silicide over the source and drain in bulk crystalline silicon structures as well as thin film SOI structures.

BRIEF DESCRIPTION OF THE DRAWINGS

The foregoing and other objects, aspects and advantages will be better understood from the following detailed description of a preferred embodiment of the invention with reference to the drawings, in which:

FIG. 1 shows a conventional MOSFET device to be silicided;

FIG. 2 shows a thin film of metal (e.g., Co) deposited on the device of FIG. 1;

FIG. 3 shows the formation of an alloy including the cobalt after exposure to a low-temperature processing;

FIG. 4 shows an amorphous Si film deposition on the alloy;

FIG. 5 shows the device after an annealing step at high temperature; and

FIG. 6 shows the device after unreacted silicon has been removed by selective etching;

FIGS. 9A and 9B illustrate the novelty of the inventive structure.

DETAILED DESCRIPTION OF A PREFERRED EMBODIMENT OF THE INVENTION

Figure 1:
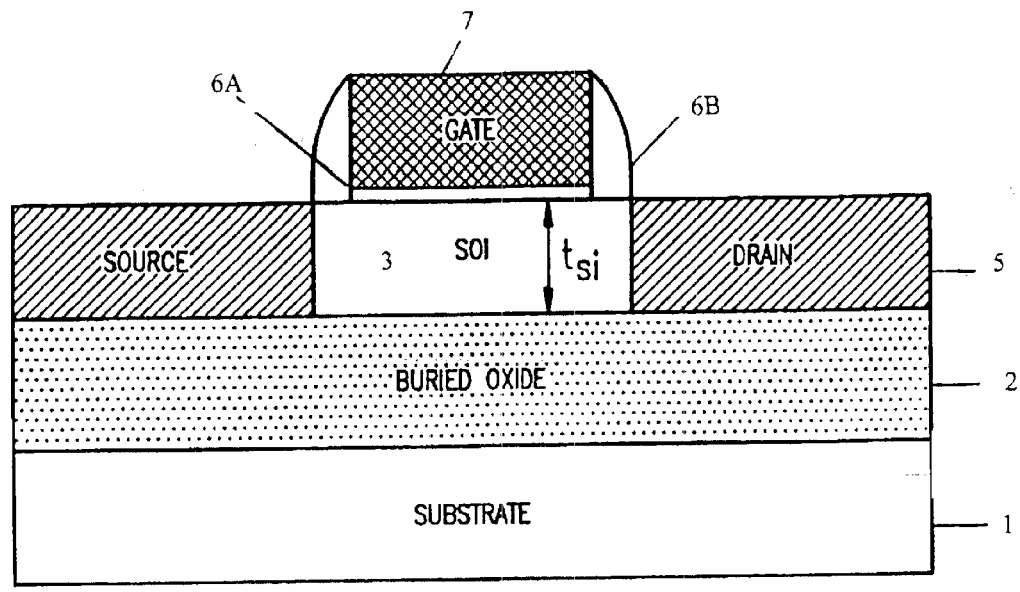
FIGS. 1–6 illustrate a self-aligned method for forming low resistivity contacts to thin film SOI MOSFETs, and more specifically.

Referring now to the drawings, and more particularly to FIGS. 1–9B, there is shown a preferred embodiment of the method of making of a self-aligned silicide which is applicable to the standard MOSFET structure, and also to non-conventional MOSFETs and structures according to the present invention. Such structures include low resistivity contacts and/or shallow junctions.

Referring now to FIG. 1, a conventional MOSFET structure 100 is shown having a substrate 1 formed of silicon, a buried oxide layer 2 (e.g., silicon oxide layer), an SOI layer 3 which thickness noted by $t_{si}$, a gate dielectric 6A (e.g., $SiO_2$), sidewall spacers 6B formed of nitride or oxide, a gate 7 (e.g. doped poly-Si, or metal), and a source 4 and a drain 5 made into the SOI film 3, typically by an implant.

The inventive method is directed to making a self-aligned silicide which is applicable to the standard MOSFET structure, and also to non-conventional MOSFETs and structures. For ease of discussion, the present invention will be applied to the conventional MOSFET of FIG. 1.

However, although the process flow is demonstrated using a conventional MOSFET structure, it is applicable to a wide variety of structures. Metals, other than Co, that are used for silicides (e.g., Ti, Ni, Pd, Pt and alloys thereof) can be used with the present invention.

Figure 2:
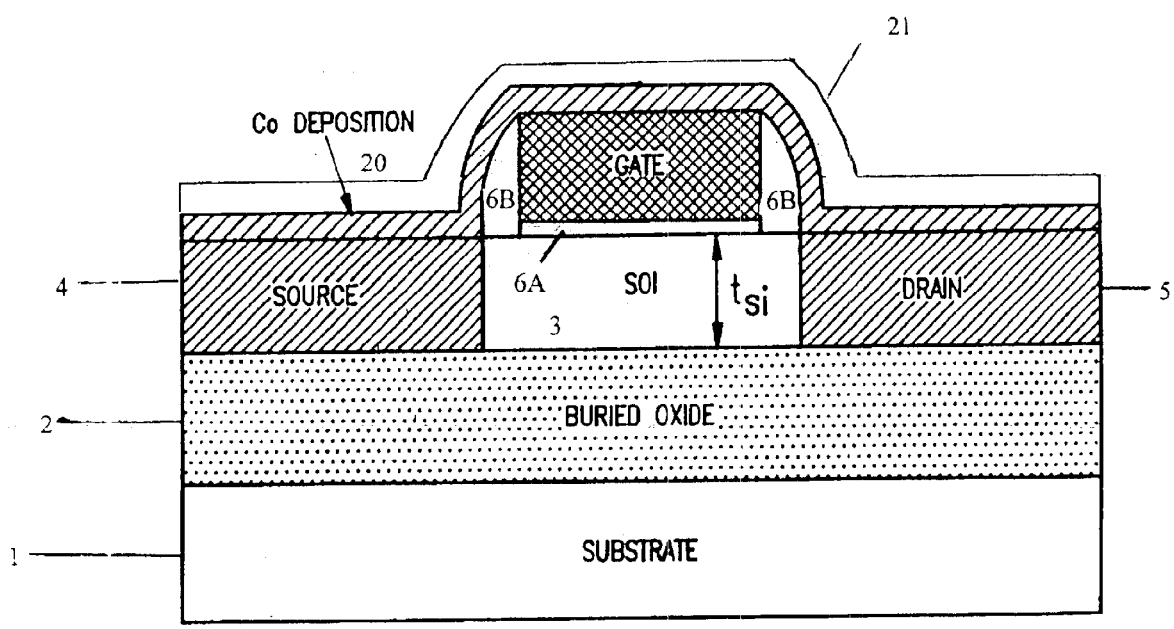

Referring to FIG. 2, a metal 20 (e.g., Co, Ni, Ti, Pd, Pt or alloys thereof) is deposited in a thickness within a range of about 7–8 nm. A TiN cap or a W cap 21 is deposited over the metal 20 to prevent oxidation during the anneal. The metal 20 is reacted with silicon in the source 4, drain 5, and gate 7 regions at a low temperature $T_1$. It is noted that if the temperature is too low, no reaction will take place. On the other hand, if the temperature is too high, then the monosilicide phase of CoSi will be formed. Since the temperature window over which the metal-rich phase $Co_2Si$ is formed is narrow, it is difficult to achieve only this phase during the first anneal. To extend the temperature window, a mixture of 80% Co and 20% Si may be deposited (e.g., by co-sputtering or evaporation from a $Si_{0.2}Co_{0.8}$ target). The temperature window for the formation of the $Co_2Si$ out of the $Si_{0.2}Co_{0.8}$ mixture is about 337° C. to about 487° C. The use of a 80% Si and 20% Co to extend the temperature window is described in U.S. Pat. No. 6,323,130, to Cyril Cabral et. al, entitled "METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING", filed on Mar. 6, 2000, incorporated herein by reference.

Figure 3:
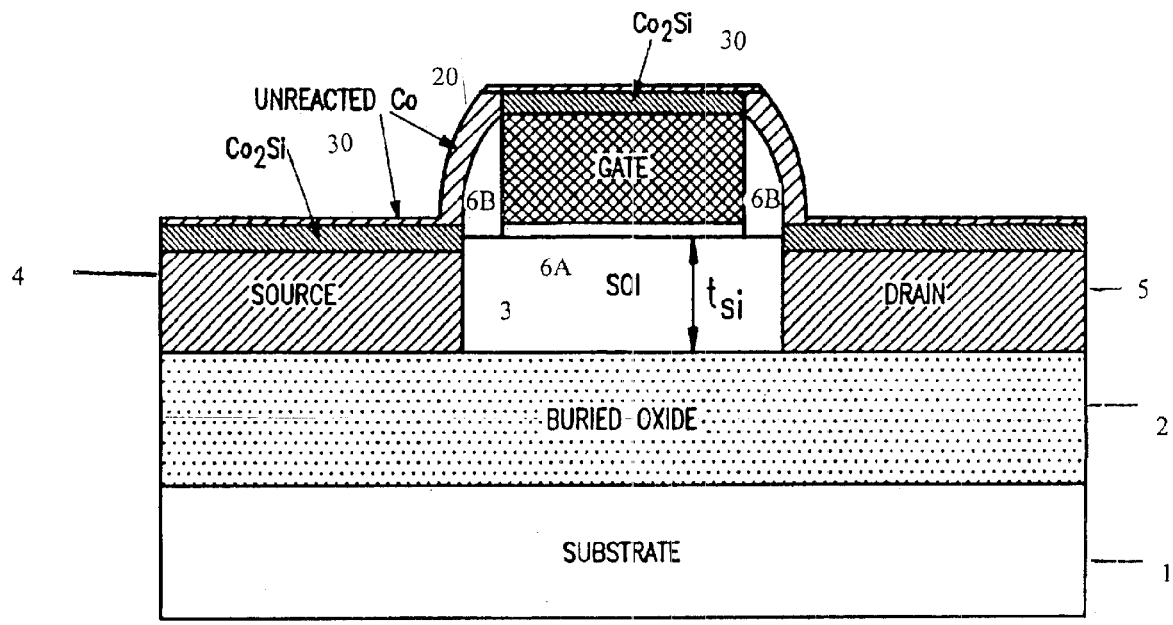

As shown in FIG. 3, the alloy $Co_2Si$ 30 is formed, as a result of applying the low temperature (e.g., $T_1$) in the anneal process to the structure of FIG. 2. (The thickness depends on the initial Co film thickness. One angstrom of Co yields 1.47 angstroms of $Co_2Si$. The typical Co film thickness is about 7 nm. Using the conversion ratio stated above, a 10.3 nm thick film of $Co_2Si$ will be obtained after the first anneal.) An upper layer of the cobalt 20 (e.g., over the alloy $Co_2Si$ 30) is unreacted Co 20.

That is, in the standard process, all of the Co which is deposited over a Si surface will react with the silicon surface and will form a silicide. On the other hand, the Co that was deposited over dielectric surfaces such as the oxide or nitride sidewalls cannot react with the Si surface and will remain as unreacted Co.

FIG. 3 demonstrates a case in which some Co is left unreacted on top of the silicide. As described above, this is not desirable in a manufacturing process. Yet, even if this does happen, the overall process of the invention will not be affected except that the silicide film will be thinner than targeted. As such, the robustness of the process is clearly demonstrated. It is noted that in most cases, there will be no unreacted Co.

For example, the unreacted cobalt 20 has a thickness dependent on the anneal time/temperature, and is removed through selective etching. That is, a too short anneal may leave some of the Co unreacted. If the temperature is too low, then the Co will not react with the SOI film. This step is similar to the etching step in the conventional salicide process with the exception that in the conventional salicide process the un-reacted Co is etched at the stage where CoSi is formed. It is noted that the deposition of the a-Si may be carried out over the CoSi phase. However, by forming the CoSi phase, much more of the Si in the SOI layer will be consumed. An example of a selective etching solution is 10:1 $H_2O_2:H_2SO_4$ at 65° C.

Figure 4:
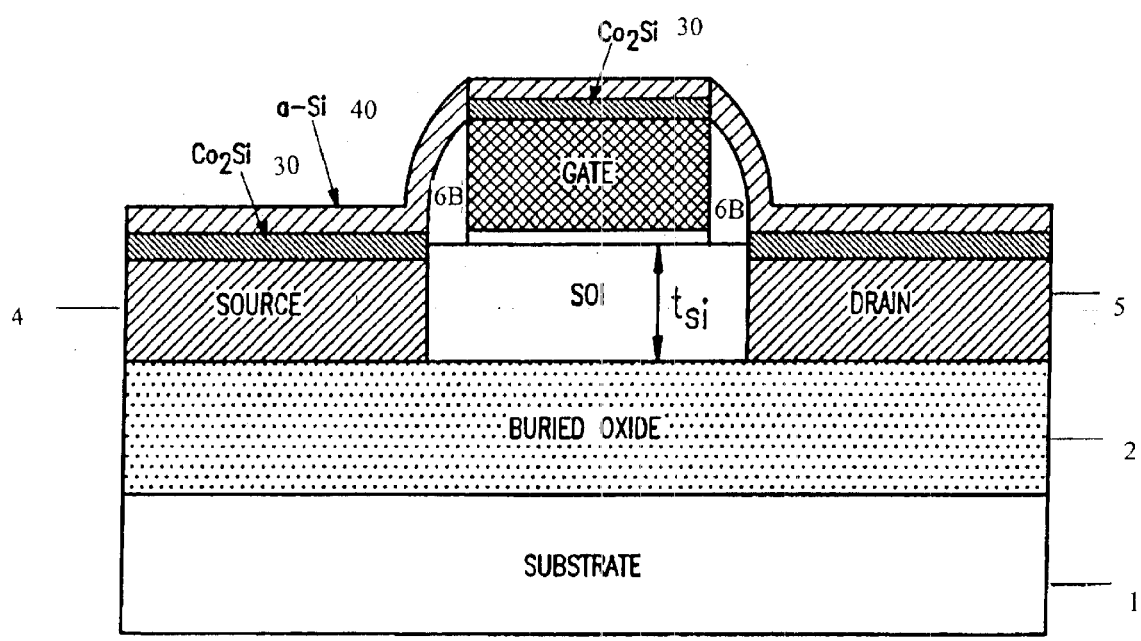

Next, referring to FIG. 4, an amorphous Si (a-Si) or a poly-Si film 40 is deposited over the alloy $Co_2Si$ 30. The a-Si film thickness depend on the initial Co film thickness. One unit of Co would require 0.91 units of Si to form $Co_2Si$, 1.82 units of Si to form CoSi and 3.64 units of Si to form $CoSi_2$. For example, suppose the process starts with a 7 nm Co film which are then reacted with the SOI film to form 10.3 nm film of $Co_2Si$. Assuming that all the Co will diffuse into the top deposited a-Si, then it requires the a-Si film to be about 19 nm thick. A more realistic assumption is that more than half but not all the Co will diffuse into the top film, so that a thinner film is actually needed. The amorphous silicon or polysilicon film 40 is annealed at a high temperature $T_2$, (e.g., $T_2>T_1$). The temperature window for the formation of CoSi is about 481° C. to about 625° C. (at about 625° C., $CoSi_2$ will start to form). Typical annealing temperature (T2) for the second anneal is about 750 ° C. These temperatures may vary slightly depending on the doping species and concentration that were implanted into the SOI film.

Hereinbelow, the amount of required Si in angstroms per angstroms of metal is described. Forming 1 angstrom of $Co_2Si$ will take 0.91 angstrom of Si, CoSi will take 1.82 angstroms of Si, and $CoSi_2$ will take 3.64 angstrom of Si. If the a-Si layer is deposited on top of the $Co_2Si$ film, then the Si consumption may be reduced by at least a half, since the $Co_2Si$ film would be reacting on both top and bottom interfaces. It is important to clean the top surface of the $Co_2Si$ and remove any native oxide before the a-Si film deposition. The existence of such an oxide at the interface may prevent the $Co_2Si$ to react with the deposited a-Si layer. The cleaning of the surface and the stripping of a native oxide may be achieved by Ar (argon) sputtering in the a-Si deposition chamber or by a short dip in a diluted HF acid.

Figure 5:
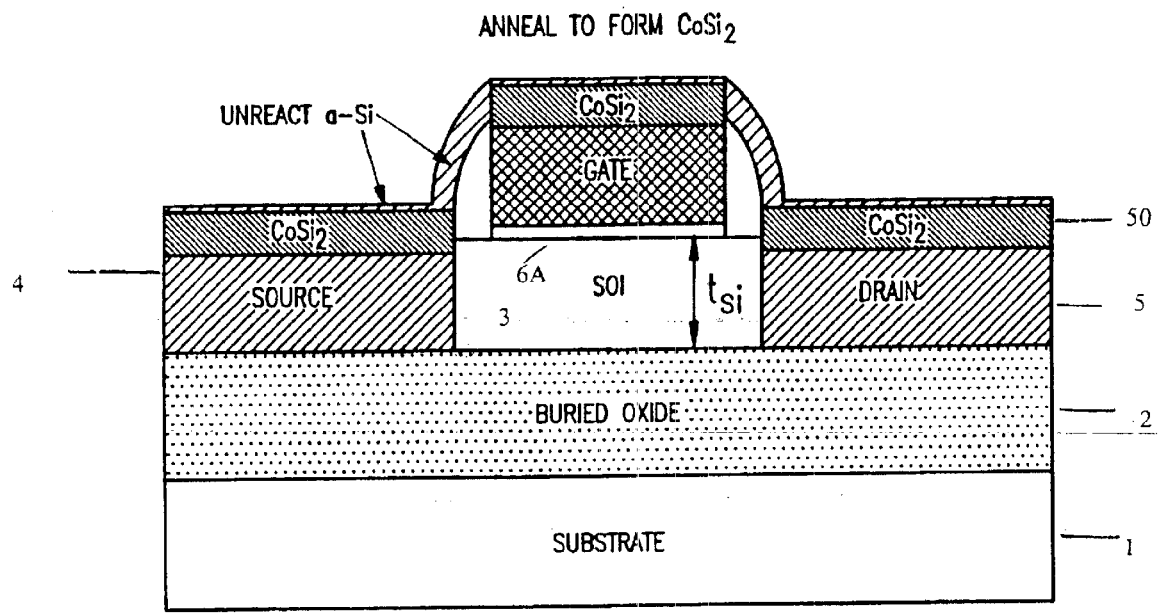

As shown in FIG. 5, as a result of the annealing operation at a high temperature $T_2$, a layer of $CoSi_2$ 50 is formed under an unreacted layer/portion 40A of the amorphous silicon or polysilicon film 40. The thickness of the layer of un-reacted amorphous silicon/polysilicon layer 40A depends on the initial thickness of the top a-Si layer 40. It is desirable that all of the $Co_2Si$ is transformed into $CoSi_2$, without consuming the entire a-Si layer. The unreacted layer/portion 40A results from the supply of Si from the a-Si exceeding that which is needed to form $CoSi_2$. In other words, the a-Si layer was too thick.

Figure 6:
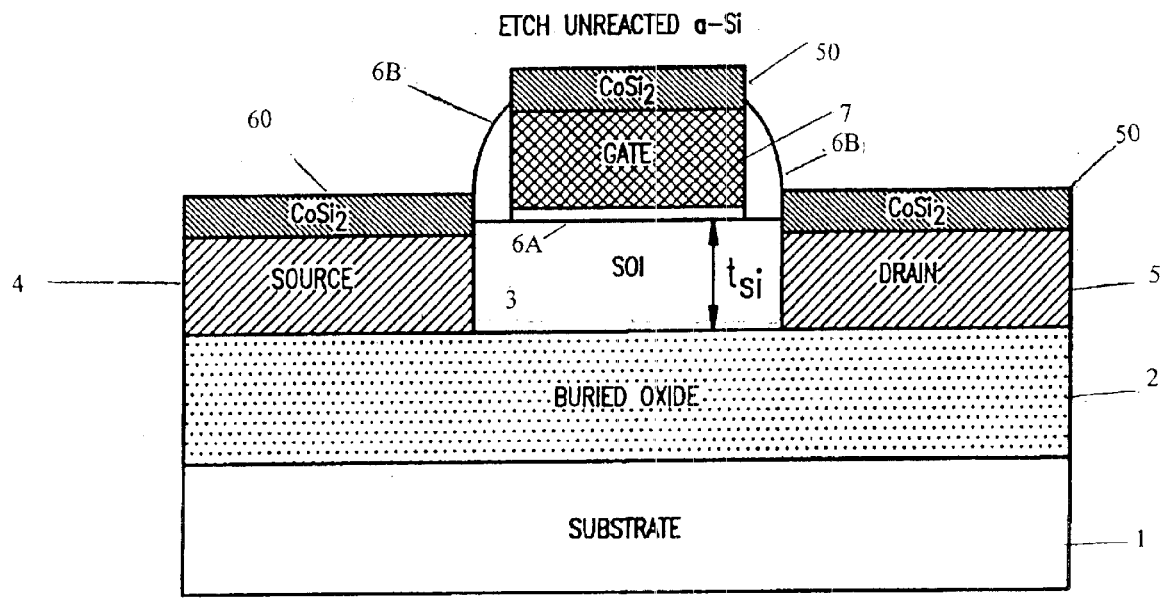
Figure 7A:
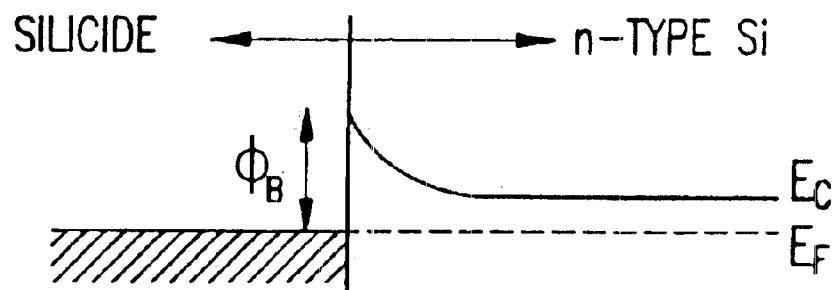
FIG. 7(a) illustrates a band diagram of a silicide/n-type Si junction that forms a Schottky barrier.
Figure 7B:
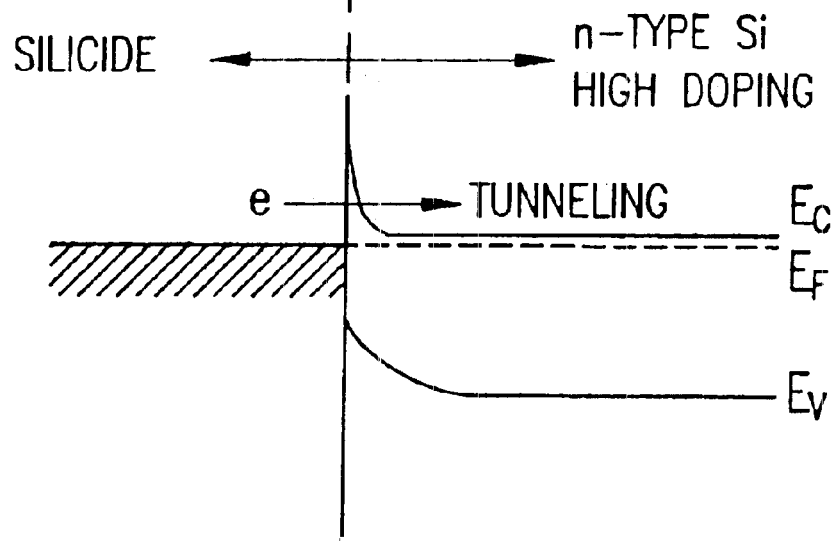
FIG. 7(b) illustrates a band diagram of a silicide/$n^{++}$-type Si junction that forms an ohmic contact by tunneling.
Figure 8:
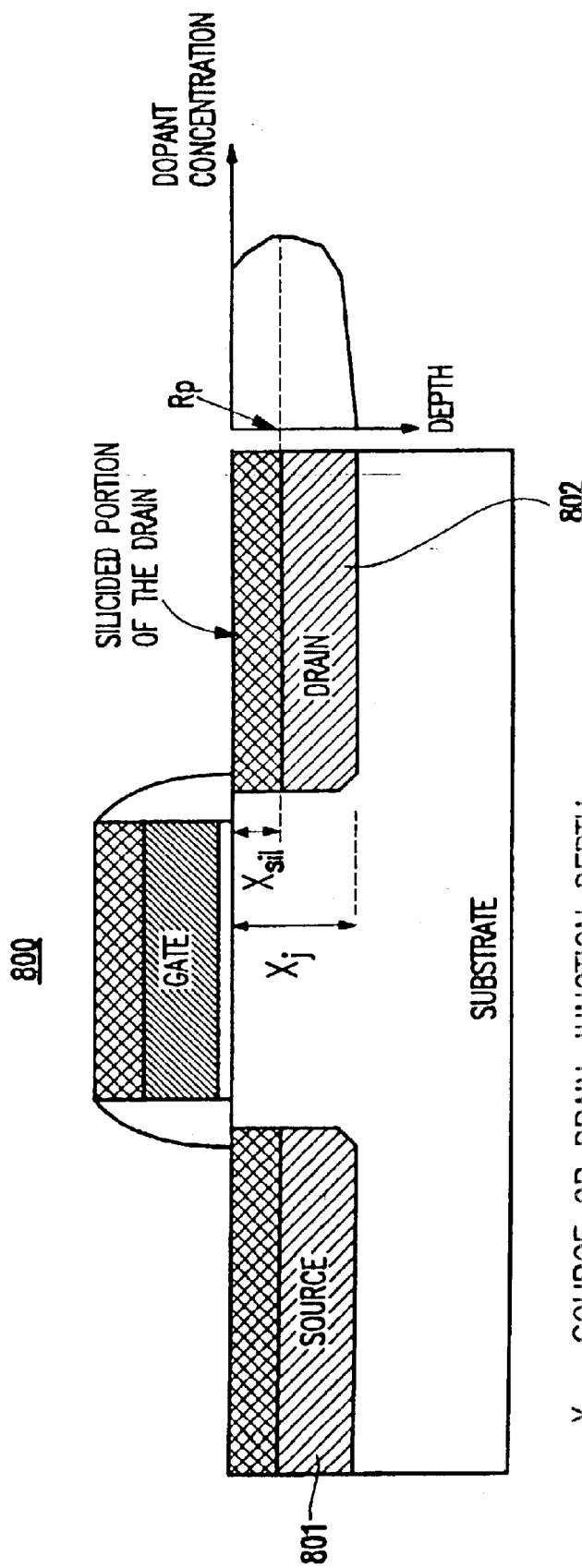
FIG. 8 illustrates requirements for obtaining a structure 800 in which good ohmic contact is made to the source 801 and drain 802 and that the silicon/Si junction is not deeper than the source/drain junction depth.

FIG. 6 illustrates the selective etching of the layer of un-reacted a-Si or poly-Si film 40 in a last phase.

Thus, with the invention, the reacting of the metal (e.g., cobalt) in an annealing operation to initially form the alloy $Co_2Si$ 30 minimizes the silicon consumption of the SOI film 3.

Additionally, the deposit of the amorphous silicon or the polysilicon film 40 on top of the alloy $Co_2Si$ 30 further reduces consumption of the SOI film 3 by a factor of two since at least half of the Co contained he $Co_2Si$ 30 will diffuse into the top amorphous silicon/polysilicon film layer 40 at the high temperature anneal which forms the $CoSi_2$.

The diffusivity of cobalt in polysilicon may be larger than in single crystal (mono-crystal) silicon. Due to this diffusivity difference between polysilicon and single crystal silicon, the high temperature anneal will consume more of the top polysilicon layer than that of the bottom single crystal SOI film.

In an alternative embodiment, the invention can be modified so that the first anneal is at an intermediate temperature, $T_3$ (e.g., $T_3$ is about 550° C.), where CoSi is formed ($T_1<T_3<T_2$). The anneal process at this temperature will consume more of the SOI film than a $Co_2Si$ formation. However, it may provide a larger temperature window for the anneal.

The larger the temperature window, the easier it is to form a given silicide phase without the risk of obtaining a mix phase. The temperature window for $Co_2Si$ is about 20° C. wide if pure Co is used. It may be widened to about 100° C. by using $Co_{0.8}Si_{0.2}$. The window may shift and vary depending on the SOI doping. This makes it difficult to obtain the $Co_2Si$ phase if the window is narrow. If pure Co rather than $Co_{O.2}Si_{0.8}$ is used, then it is easier to form CoSi due to its large temperature window of about 150° C.

Also, the etch selectivity of CoSi, with respect to Co, is higher than that of $Co_2Si$ with respect to Co. The advantages of this selectivity include better reliability and precision of the resulting product. After the Co is reacted to form CoSi, the unreacted Co must be etched away. Otherwise, the source/drain regions will be shortened to the gate. The etchant should be selective to CoSi. That is, it should only remove the Co and leave the CoSi alloy intact. The etching selectivity is typically higher if the alloy contains less Co and more Si. Thus, CoSi is expected to be more resistant to the etch of Co than $Co_2Si$. The remainder of the steps in the process are the same.

Second Embodiment

The second embodiment of the present invention employs substantially the same process as described above. However, while the process described above has been applied to Silicon-On-Insulator (SOI) MOSFETs, the process is also equally applicable to bulk MOSFETs, as discussed below.

Thus, the second embodiment uses substantially the same process. For the reader's greater clarity, the process steps are summarized below.

First, a blanket deposition of a metal such as Co, Ti or Ni, is performed. For example, the typical required film thickness for Co is about 7–8 nm. The Co deposition is followed by a TiN cap deposition of about 20 nm thick, that prevent oxidation during anneals.

Then, a first rapid thermal anneal (RTA) is performed to form the CoSi, C49 $TiSi_2$, or NiSi phase. For example, a 525C anneal would react the deposited Co with the underlay Si, converting some of the Si into CoSi.

Then, the unreacted metal is selectively etched. For example, Co that was deposited over non-Si surfaces, such as the dielectric sidewall spacers of the device, cannot react with the Si during the anneal and therefore would not convert into CoSi. The unreacted Co is etched a selectively, leaving the CoSi regions intact.

Then, a blanket deposition of a silicon film is performed. For example, the silicon may be sputtered or evaporated. Following the example outlined above, the typical required Si film thickness would be 15 nm or thicker to ensure that the top Si film would have sufficient silicon to form the di-silicide, $CoSi_2$. The top mono-silicide surface should be cleaned, so that the deposited silicon would be free to react with the underlay mono-silicide.

Thereafter, a second RTA is performed to form the $CoSi_2$ or C54 $TiSi_2$ low resistive phase. For example, the CoSi is annealed at about 750C, to form the $CoSi_2$ phase. It is noted that the silicon consumption from the substrate is reduced due the supply of Si from the deposited Si cap layer. As mentioned earlier in the case of Nickel, the NiSi is lower resistivity phase, and thus a second RTA is not used.

Further, the unreacted silicon is selectively etched. For example, tetramethylammonium hydroxide (TMAH) may be used to etch the silicon and stop on the $CoSi_2$ film.

The silicon consumption may be further reduced if a mixture of Co and Si is deposited in the first step above. The process of using Co alloys was first disclosed in the above-mentioned U.S. Pat. No. 6,323,130. Thus, instead of a pure Co deposition (step 1), Co is co-deposited with Si. The use of such a mixture of $Co_{1-x}Si_x$, is limited to about x<0.3, or otherwise bridging from source/drain to gate would occur. The reduction in the Si consumption from the wafer is achieved due to the following reasons:

First, the temperature window in which the metal rich phase, $Co_2Si$, is formed is broadened to about 100C. This makes it possible to replace the first anneal (step 2) that forms the mono-silicide phase, CoSi, with an anneal that would form the metal rich phase, $Co_2Si$. The formation of the metal rich phase would consume only half of the Si that would have been consume by the mono-silicide phase. Now, the cap silicon layer may be deposited over the metal rich phase (after the etching of the unreacted Co—step 3). Thus, the silicide formation is carried out with a second source of silicon on top of the silicide film almost from the very beginning. This reduces the consumption of Si from the substrate.

Secondly, some of the silicon which is required to form the silicide phase is already contained in the deposited mixture, and thus the substrate consumption is reduced.

Additionally, there are other alternative approaches to the invention discussed above including raised source/drain by selective epitaxial growth of Si, and deposition of CoSi mixture.

That is, alternative conventional methodologies (e.g., which are less desirable when contrasted to the embodiments of the invention described above), include thickening a SOI layer (by at least the amount that will be consumed by the silicide in source and drain regions by using selective epitaxial growth of silicon on these regions, fabricating different silicide thicknesses over the gate, source and drain regions by laser melting, and the deposit of a silicon alloy ($Co_{1-x}Si_x$, where x<0.2) to limit the amount of silicon consumed at source, drain, and gates during silicide formation.

Raised Source/Drain by Epitaxial Growth of Si

Silicon can be added to the source and drain region selectively by selective epitaxy prior to the metal deposition. That is, the epitaxial growth of Si is performed by thickening a SOI layer in the source/drain regions through selective epitaxial growth of Si in these regions. This alternative has several disadvantages when compared to the process of the present invention.

First, the epitaxial growth must be selective, otherwise Si growth will occur on the sidewalls of the device. This condition can lead to shorting the gate to the source and the drain. To avoid this problem, the choice of the sidewall material to use is narrowed because only growth-resistant materials can be selected.

Further, the growth temperature is an important parameter in determining the selectivity of the growth. The Si epitaxial growth loses selectivity at low growth temperatures. "Low growth temperatures" depend on the growth technique, and the silicon source. The most selective source is $SiCl_4$, but it also requires the highest deposition temperature (about 900° C. to 1200° C). Silane ($SiH_4$) can be used for low temperature deposition (as low as about 650° C.), but it exhibits very little selectivity, if any. Therefore, a sufficiently high growth temperature (e.g., about 900° C.) is required to guarantee selectivity. The required high growth temperature may be in excess of the thermal budget incurred in the conventional salicide process.

A further problem with producing a raised source/drain by epitaxial growth of silicon is the process robustness. Silicon epitaxy is very sensitive to surface preparation and cleaning. Different surface treatments can lead to different defects in the film. Oxide residuals (e.g., even an atomic monolayer) can prevent epitaxial growth.

Another problem with the epitaxial growth approach, known as "growth rate dependency on feature size", can occur. In a chemical vapor deposition (CVD)-type epitaxy, the growth rate may be dependent on the topography, the dimensions of the growth area, and the ratio between the growth to non-growth areas. This may lead to a growth of different film thicknesses in devices that are embedded in different circuit layouts. This condition is an additional dimension that must be included in a manufacturing process, and hence requires additional costs. The present invention does not require epitaxy, and is therefore not limited by the difficulties imposed by epitaxy.

Deposition of $Co_{1-x}Si_x$ Alloy

Another alternative to the present invention may be the deposition of CoSi mixture. However, this method is problematic as well.

That is, the deposition of a Co film that contains silicon reduces the silicon consumption from the wafer as some of the Si needed for the silicide formation is already contained in the Co film. However, this technique is limited to a $Co_{1-x}Si_x$ mixture that has a small enough concentration of Si (x<<1) so that the deposited alloy on the oxide side-walls can be removed by selective etching. It can therefore reduce the consumption of Si from the substrate by only 10 to 15%.

The present invention can use this method to further decrease the Si consumption by depositing $Co_{1-x}Si_x$ instead of pure Co. A second advantage of $Co_{1-x}Si_x$ is the larger temperature window which is available for the formation of the metal-rich phase.

Thus, the present invention can provide an optimum structure for meeting the shallow junction requirement with the requirements associated with the silicide/Si junction position.

The invention uses conventional fabrication techniques, and does not have a throughput problem. That is, a conventional approach to siliciding uses laser melting, which is a relatively new technique that allows the fabrication of different silicide thicknesses over the gate and over the source/drain region. This technique has not been applied in a manufacturing context and therefore its usage in practice is unknown. However, the throughput of the technique may be lower than that achieved with the other techniques such as raised source/drain, deposition of CoSi alloy, etc. In laser melting, laser annealing is carried out per wafer (i.e., the wafers are processed sequentially) one at a time. Raised source/drain epitaxy and the present invention are parallel techniques in the sense that the entire wafer lot may be processed together (e.g., a single deposition is carried out on all wafers).

Additionally, it is noted that the thermal budget required by the invention is the same as in a conventional salicide process.

Thus, the present invention overcomes the above-mentioned and other problems of the conventional techniques and allows forming silicon-on-insulator (SOI) and bulk MOSFETs having ultra-thin silicon films and while preventing (or at least minimizing) the high source/drain series resistance and maintaining its efficiency. Thus, bulk or thick SOI films are unnecessary with the inventive method.

Further, series parasitic resistance is minimized in order to facilitate the fabrication of high performance thin film SOI MOSFETs with the inventive method.

Further, with, for example, the second embodiment of the invention, it is further possible to obtain good control of the silicide over shallow source and drain junctions in bulk crystalline silicon structures.

It is noted that, with both embodiments, looking at the structure from the top down, the device (structure) appears the same. It is not until one examines the substrate, that a difference is found (e.g., a bulk or a buried oxide substrate). Further, since the invention is essentially a superficial process, it does not matter what is buried with regard to the method of the invention, and the process is equally applicable to both bulk and SOI substrates. The invention works equally well regardless of what is buried below the initial (first) layer of silicon where the silicide reaction is formed.

Turning to FIGS. 9A and 9B, it can be clearly seen that the inventive structure is clearly differentiated from a raised source-drain structure formed by selective epitaxy.

That is, for purposes of the present invention, "epitaxy" is defined as "the growth on a crystalline substrate of a crystalline substance that mimics the orientation of the substrate". Keeping this definition in mind, it can be understood that a crystal grown by epitaxy would always be aligned to the underlay substrate, regardless of the orientation of a window that defines a growth region.

FIGS. 9A and 9B respectively illustrate selective epitaxial growth for two different rectangular windows 901A, 901B exposing a substrate region 910. The windows 901A, 901B are openings in a mask on which no nucleation occurs. The windows 901A, 901B are shown by a dashed line. To further simplify the discussion, only the (100) and (110) sets of planes are considered when looking at the crystal growth.

In FIG. 9A, the left window 901A defines a rectangle which is perfectly aligned along the 110 and 011 crystal orientation, whereas in FIG. 9B the right window 901B is aligned with the 010 and 100 orientations. The substrate surface in both windows is aligned with the 001 orientation. It is well known that the growth rate is strongly dependent on the crystal orientation. For the following discussion, it is assumed that the (110) plane set is slow-growing compared to the fast-growing (100) planes. This is illustrated by the coordinate system shown on the top of FIGS. 9A and 9B.

Since the growth rate is dependent on the crystal orientation, the grown crystal would exhibit facets. These faces develop into the slow-growing planes. FIG. 9B shows the grown crystal at two different growth times. At $t_{growth}=$ t1, the grown crystal shape is still close to the original window that defines the growth area. However, as the growth proceeds ($t_{growth}=$t2), the slow growing (110) planes become dominant, and the grown crystal no longer follows the shape of the underlay window. As growth would proceed, the shape of the crystal would converge into a pyramid having a base which is oriented along the 110 and 011 orientations (as that of the left window 901B). As illustrated by FIG. 9A, the grown crystal would maintain the window shape only if the window is aligned to the slow-growing planes.

Therefore, a raised source-drain structure by epitaxy is limited to constraints imposed by the crystal orientation. The shape and the orientation of the window that defines the growth area would not necessarily be replicated to the grown crystal, since it always follows the orientations defined by the underlay crystal substrate.

However, the salicide method of the present invention does not rely on epitaxial growth, and is therefore free of crystal orientation constraints. Thus, in the invention, it does not matter what the crystallographic directions are because the invention does not rely on such directions to form the inventive structure.

Moreover, the raised source-drain formed by the inventive process does not exhibit facets and is defined by the source and drain windows. Hence, the shape that is obtained is facet-free.

While the invention has been described in terms of preferred embodiments, those skilled in the art will recognize that the invention can be practiced with modification within the spirit and scope of the appended claims.

The method and structure of the present invention are not limited to a specific silicide-forming metal. Further, the invention, is not limited to one particular device as described above, but can also be used in devices with a non-planar source/drain region, such as a polysilicon sidewall source drain (e.g., see P. M. Solomon, H.-S. P. Wong, "Method for Making Single and Double Gate Field Effect Transistors with Sidewall Source Drain Contacts", U.S. Pat. No. 5,773,331, Jun. 30, 1998, incorporated herein by reference; and T. Yoshimoto et al., "Silicided Silicon-Sidewall Source and Drain Structure for High Performance 75-nm gate length pMOSFETs," 1995 *Symposium on VLSI Technology*, digest p. 11).

What is claimed is:

1. A method for fabricating a silicide for a semiconductor device, said method comprising:

depositing a metal containing silicon on a silicon substrate;

reacting said metal containing silicon to form a first silicide phase;

etching any unreacted metal containing silicon;

depositing a silicon cap layer over said first silicide phase;

reacting the silicon cap layer to form a second silicide phase, for said semiconductor device; and etching any unreacted silicon from said silicon cap layer.

2. The method of claim 1, wherein said substrate comprises a bulk silicon substrate.

3. The method of claim 1, wherein said substrate comprises a silicon-on-insulator (SOI) substrate.

4. The method of claim 1, wherein said first silicide phase comprises the first forming silicide phase.

5. The method of claim 1, wherein said first silicide phase comprises a metal-rich phase.

6. The method of claim 1, wherein said depositing said metal containing silicon is for extending a temperature window in which a silicide metal-rich phase exists.

7. A method for fabricating a silicide for a silicon region, said method comprising:

depositing a metal containing silicon on a bulk silicon substrate;

reacting said metal containing silicon to form a first silicide phase;

etching any unreacted metal containing silicon;

depositing a silicon cap layer over said first silicide phase;

reacting the silicon cap layer to form a second silicide phase; and etching any unreacted silicon from said silicon cap layer.

8. The method of claim 7, wherein said depositing of said metal containing silicon comprises performing a blanket deposition, wherein said metal comprises one of Co and Ti.

9. The method of claim 8, wherein said blanket deposition includes cobalt having a film thickness in a range of approximately 7 nm to approximately 8 nm.

10. The method of claim 9, wherein said blanket deposition is followed by a TiN cap deposition for preventing oxidation during a subsequent anneal processing.

11. The method of claim 7, wherein said reacting of said metal containing silicon comprises performing a first rapid thermal anneal (RTA) to form a metal-silicon phase, such that the deposited metal containing silicon with the underlying bulk silicon substrate, converts some of the Si into metal-Si, wherein said etching comprises selectively etching any unreacted metal, thereby leaving the metal-silicon regions intact, wherein said depositing of said silicon cap comprises performing a blanket deposition of a silicon film, and wherein said reacting of said silicon cap comprises performing a second RTA to form a metal di-silicide.

12. The method of claim 7, wherein said method forms a raised source-drain structure by a blanket deposition which uses processing other than epitaxial processing.

13. The method of claim 7, wherein said first silicide phase comprises the first forming silicide phase.

14. The method of claim 7, wherein said first silicide phase comprises a metal-rich phase.

15. The method of claim 7, wherein said depositing said metal containing silicon is for extending a temperature window in which a silicide metal-rich phase exists.

16. A method for fabricating a silicide for a silicon region, said method comprising:

depositing a metal on a bulk silicon substrate;

reacting said metal to form a first silicide phase;

etching any unreacted metal;

depositing a silicon cap layer over said first silicide phase;

reacting the silicon cap layer to form a second silicide phase; and etching any unreacted silicon from said silicon cap layer, wherein said metal is co-deposited with silicon.

17. The method of claim 16, wherein said metal is cobalt, and said metal co-deposited with silicon is $Co_{1-x}Si_x$, with $x<0.3$.

18. The method of claim 16, wherein said first silicide phase comprises a metal-rich phase.

19. The method of claim 16, wherein said depositing said metal containing silicon is for extending a temperature window in which a silicide metal-rich phase exists.

20. A method for fabricating a silicide, said method comprising:

providing a substrate having a silicon layer;

depositing a metal containing silicon over said silicon layer;

reacting said metal containing silicon to form a first silicide phase;

etching any unreacted metal containing silicon; and depositing a silicon cap layer over said metal containing silicon;

reacting the silicon cap layer, to form a second silicide phase; and etching any unreacted silicon from said silicon cap layer.

21. The method of claim 20, wherein said first silicide phase comprises a metal-rich phase.

22. The method of claim 20, wherein said depositing said metal containing silicon is for extending a temperature window in which a silicide metal-rich phase exists.

23. A method for fabricating a silicide for a semiconductor device, said method comprising:

depositing a metal containing silicon on a silicon substrate;

reacting said metal containing silicon to form a first forming silicide phase;

etching any unreacted metal containing silicon;

depositing a silicon cap layer over said first forming silicide phase;

reacting the silicon cap layer to form a second silicide phase, for said semiconductor device; and etching any unreacted silicon from said silicon cap layer.

24. The method of claim 23, wherein said first forming silicide phase comprises a metal-rich phase.

25. The method of claim 23, wherein said depositing said metal containing silicon is for extending a temperature window in which a silicide metal-rich phase exists.

26. A method for fabricating a silicide for a silicon region, said method comprising:

depositing a metal containing silicon on a bulk silicon substrate;

reacting said metal containing silicon to form a first silicide phase;

etching any unreacted metal containing silicon;

depositing a silicon cap layer over said first silicide phase;

reacting the silicon cap layer to form a second suicide phase; and etching any unreacted silicon from said silicon cap layer, wherein said metal is nickel.

27. The method of claim 26, wherein said first silicide phase comprises a silicon-rich phase.

28. The method of claim 26, wherein said depositing said metal containing silicon is for extending a temperature window in which a silicide metal-rich phase exists.

* * * * *